United States Patent

Westerberg

[11] 4,060,816
[45] Nov. 29, 1977

[54] SCANNING APPARATUS, FOR PRODUCING MASKS FOR MICRO CIRCUITS

[76] Inventor: Gerhard Westerberg, Hastskovagen 7A, 183 50 Taby, Sweden

[21] Appl. No.: 656,282

[22] Filed: Feb. 9, 1976

[30] Foreign Application Priority Data

Feb. 13, 1975 Sweden .................. 7501605

[51] Int. Cl.² .......................... G03B 27/00
[52] U.S. Cl. ................ 354/4; 219/121 L; 346/76 L; 346/108; 350/6
[58] Field of Search ............. 346/76 L, 108; 219/121 L, 121 LM; 355/53; 354/4; 350/6

[56] References Cited

U.S. PATENT DOCUMENTS

| 3,449,754 | 6/1969 | Stutz | 346/29 |
| 3,573,849 | 4/1971 | Herriot et al. | 346/108 |
| 3,632,205 | 1/1972 | Marcy | 355/53 |
| 3,903,536 | 9/1975 | Westerberg | 355/53 X |
| 3,925,785 | 12/1975 | Firtion et al. | 346/76 L X |

*Primary Examiner*—Joseph W. Hartary
*Attorney, Agent, or Firm*—Silverman & Cass, Ltd.

[57] ABSTRACT

A scanning device for providing rapid accurate mechanical line scanning of a preferably flat surface includes a radiation source, a radiation sensitive medium and apparatus for providing relative movement between the radiation source and the medium. The apparatus includes a driving device and a slide structure which is designed to oscillate at substantially its self resonant frequency in order to increase accuracy of operation.

3 Claims, 4 Drawing Figures

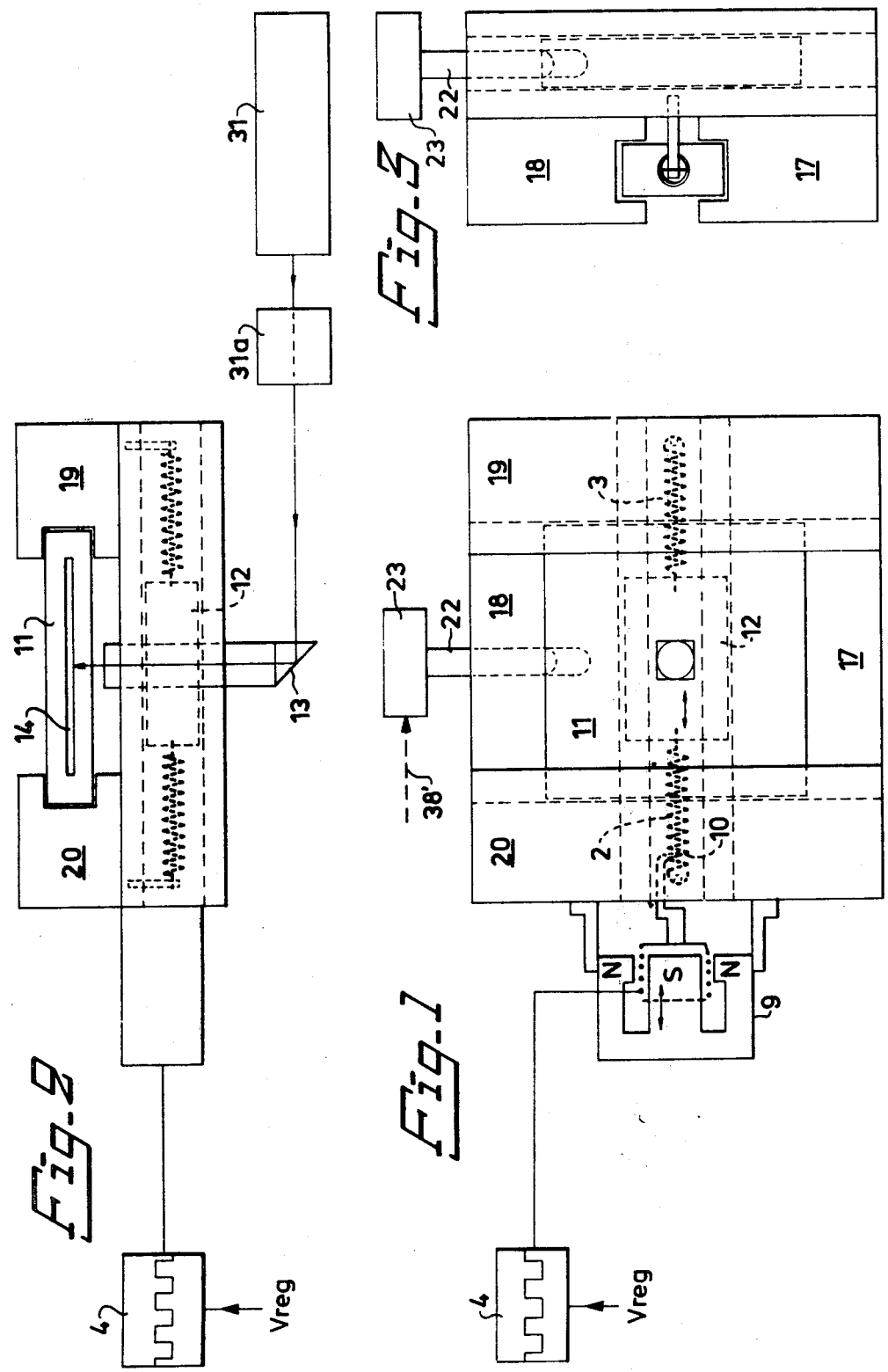

SCANNING APPARATUS, FOR PRODUCING MASKS FOR MICRO CIRCUITS

BACKGROUND OF THE INVENTION

The present invention relates to a scanning apparatus for providing rapid and accurate mechanical line scanning of a preferably flat surface by means of a beam from a ray emitting source, with the object of providing a predetermined image on the surface with the help of a photo technical process. More particularly, the scanning apparatus is intended for very accurately producing the pattern of a mask which is to be used in producing micro circuits.

From the Swedish Patent application 11727/72, now No. 375216, there is previously known a device of the kind in question, for generating mask patterns for producing micro circuits.

The object of the present invention is to provide a scanning apparatus, which is at least as accurate as the one previously known, lighter to drive so that it can be made more rapid than the previously known apparatus, and which is less exposed to wear and therefore has more durable accuracy.

SUMMARY OF THE INVENTION

By allowing the rapidly mobile slide to constitute the main mass in an oscillating system, the corresponding scanning movement can be made to take place rapidly by selecting a high self or natural frequency for the oscillating system. Direct mechanical driving of the slide in the same way as in the previously known apparatus above will then be unsuitable because of large mass forces in a rapid scanning movement, since the oscillation amplitude is considerable. By introducing a mechanical impedance adjustment between a driving means with a small oscillating amplitude and the slide, which has a considerably larger oscillating amplitude, the driving means can be simplified. In a preferred embodiment, the apparatus according to the present invention has therefore been provided with an electromechanical driving means, known per se, of the same type as used for driving a loudspeaker diaphragm. Such a driving device can be used for the relatively high frequences here employed, and can thus give rapid scanning.

BRIEF DESCRIPTION OF DRAWING FIGURES

In the following, a preferred embodiment will be described in detail while referring to the attached drawing on which:

FIG. 1 shows an embodiment of the apparatus according to the invention, as seen from above, FIG. 2 shows the apparatus according to FIG. 1, as seen from the front, FIG. 3 shows the apparatus according to FIG. 1, as seen from the side, and FIG. 4 schematically shows a preferred amplitude regulating device.

DETAILED DESCRIPTION OF PREFERRED EMBODIMENT

Figure 4:
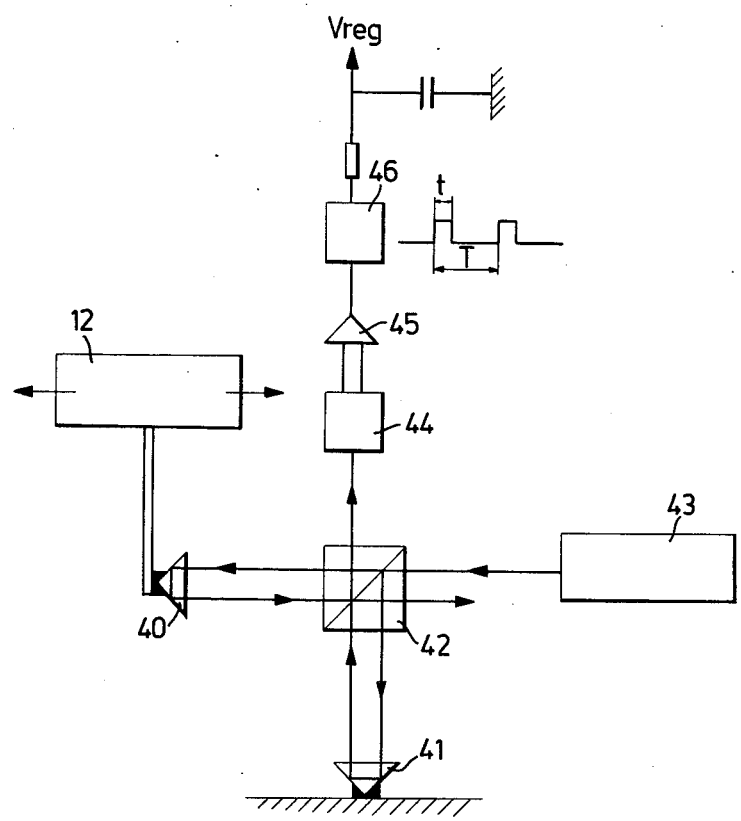

On the drawing there is shown an embodiment of the invention, having a first slide 11, which is driven by a step motor 23 via a transmission device 22. The step motor is fed with a pulse train 38. The first slide obtains a relatively slow step movement in this way. The first slide is precisely mounted in a frame structure comprising four beams 17, 18, 19, 20. The first slide 11 is arranged to carry a radiation sensitive substance or workpiece 14, which is arranged to be struck by a focused beam which is emitted from a laser 31 and which has passed a modulator 31a. The apparatus furthermore has a second slide 12 which carries a focusing means 13 for said beam. The second slide 12 is precisely mounted, preferably by means of pneumatic bearings, on the frame 17, 18, 19, 20 and mobile at right angles to the direction of travel of the first slide 11. It is arranged to carry out a rapid reciprocating movement so that when the slide 11 also carries out its movement, a line raster will be recorded on the workpiece 14 by the laser beam. Since the laser beam intensity is modulated in the modulator 31a, an image or a pattern will appear at this line raster.

In the shown embodiment according to FIG. 1, the rapidly mobile slide 12 is pneumatically mounted to reduce friction to a minimum. Operating the slide according to the self frequency principle is hereby facilitated.

The slide 12 is tensioned between two helical springs 2 and 3, according to FIG. 1. If it is taken out of the equilibrium position, it oscillates about the latter with a natural frequency which is determined by the mass of the slide and the available spring force (spring factor). Because of the small losses, an oscillation can be set up by a small expediture of energy. This is done in FIG. 1 by an electrodynamic or electromagnetic driving means 9 (loudspeaker diaphragm driving system), which is driven by a generator consisting, according to the example, of a pulse generator 4 (a sinus generator is also conceivable).

The generator is adjusted to a frequency corresponding to the self or natural frequency of the oscillating mechanical system. The generator power is adjusted so that required amplitude in the oscillation is obtained by a good margin. Exact regulation of the amplitude of the oscillating slide can be carried out in different ways, e.g. with the help of a speed sensing device or with an end position sensing device. When designing speed sensing devices, such optical or magnetic techniques giving a measuring pulse train are used to advantage. Examples of such techniques are that of laser interferometry, generating a light pulse by allowing a light beam to pass a fixed and a mobile optical grating, and generating an electrical pulse according to the tape recorder principle, e.g. with the help of a movable magnetic scale and a fixed magnetic head.

According to a preferred embodiment, the speed of the slide 12 is sensed by interferometer technique known per se, which is shown schematically in FIG. 4. A beam from the measuring laser 43 (He-Ne-laser with a wavelength of 6328 Angstrom) is divided on passing through the beam divider 42 into one component towards the movable mirror 40, which is attached to the oscillating system, and one component to the fixed reference mirror 41. The return beams are mixed together again in the beam divider 42 and sent to the photodetector 44. The signal from the photodetector is amplified by the amplifier 45, and in the pulse shaper 46 there is generated a measuring pulse train, the period T of which varies with the speed of the oscillating system. After an RC-circuit, the regulating signal $V_{reg}$ going to the generator 4 will be the average voltage of said measuring pulse train, and the shorter the period T is, the higher is the $V_{reg}$ generated. The feed back signal $V_{reg}$ subsequently affects the power of the generator 4 so that the speed of the oscillating system (and thereby its amplitude) is stabilized at the desired value.

The driving device 9 can be connected directly to the slide 12 but to reduce the required stroke, the "loudspeaker coil" is connected by the spring 2 close to its point of attachment 10. In this way, the loudspeaker coil only needs to move a few millimeters for a slide amplitude of 5–10 cm. Excitation can also take place with the assistance of a motor.

It is obvious that the present invention can be given further embodiments without departing from the inventive conception. For example, the helical springs can be replaced by flat springs, the driving means being connected some distance from the fixed end of the flat spring. The driving device in the shown embodiment consists of a suitable electrodynamic driving system for a loudspeaker diaphragm. However, it is conceivable to use an electromagnetic or piezoelectric system for the same purpose. It is also conceivable to use a pneumatic driving device with a fluidistor as amplitude sensing means, and fluidistors as amplifiers for the control signal. Other driving devices can also be used, e.g. such as are utulized in electric clocks for putting the pendulum into motion.

As already mentioned, exact amplitude regulation can also take place by an end position sensing device. Such means can consist of an inductive, capacitive, pneumatic or optical transducer.

Further, the feed back signal can be a voltage controlling the frequency of the generator 4, so that from a normal value in the vicinity of the frequency of the oscillating system, this frequency is brought closer to the oscillating system frequency when the amplitude should be increased, and farther away from this value when the amplitude should be decreased. Such a feed back voltage can be obtained in several ways, which are obvious to those skilled in the art. Finally, the feed back signal can be a voltage controlling the generator phase in relation to the oscillating system so that its amplitude decreases the more the generator comes out of phase and vice versa.

What I claim is:

1. In a device for mechanically scanning a surface (14) on which a mask pattern is adapted to be generated in the manufacture of micro circuits, having a source of radiation (31), a radiation sensitive medium on said surface, a first slide (11) carrying said surface, a drive device (23) for reciprocating the first slide in one direction, a second slide (12), means (13) carried by the second slide for transmitting radiation from said source to the radiation sensitive medium on said surface, and drive means connected to the second slide for reciprocation thereof in another direction to scan said surface, comprising means mounting the second slide for mechanical vibration at a natural frequency, pulsing means (9) operating at said natural frequency and elastically coupled continuously to the second slide for maintaining said reciprocation of the second slide at an adjusted amplitude, signal generator means (4) connected to the pulsing means for drive thereof at said natural frequency of the second slide, sensing means for measuring the period of reciprocation of the second slide, and feedback control means connecting the sensing means to the signal generator means for maintaining said reciprocation of the second slide at the adjusted amplitude.

2. The combination of claim 1 wherein said vibration mounting means includes slide bearing means (17–18) for establishing a path of travel for the second slide, and spring means connected to the second slide for continuously applying a spring restoring force thereto.

3. The combination of claim 2 wherein said spring means includes a pair of opposing springs (2 and 3) fixedly connected to the second slide, and means fixedly anchoring the springs in spaced relation to the slide along said path of travel, the pulsing means being engageable with one of the springs adjacent to the anchoring means.

* * * * *